(12) United States Patent
Kinzer

(10) Patent No.: US 7,323,745 B2
(45) Date of Patent: Jan. 29, 2008

(54) TOP DRAIN MOSFET

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/042,993

(22) Filed: Jan. 25, 2005

(65) Prior Publication Data

US 2005/0194636 A1 Sep. 8, 2005

Related U.S. Application Data

(60) Provisional application No. 60/539,549, filed on Jan. 26, 2004.

(51) Int. Cl.
*H01L 29/94* (2006.01)

(52) U.S. Cl. ............. 257/328; 257/330; 257/331; 257/329; 257/333; 257/341; 257/342; 257/510

(58) Field of Classification Search ........ 257/327–331, 257/491–493, 496, 333, 341, 342, 510, E29.118, 257/E29.131, E29.13, E29.201, E29.257, 257/E29.26
See application file for complete search history.

(56) References Cited

U.S. PATENT DOCUMENTS 5,134,448 A * 7/1992 Johnsen et al. ............. 257/330
6,436,770 B1 * 8/2002 Leung et al. ............... 438/268

* cited by examiner

*Primary Examiner*—Minhloan Tran
*Assistant Examiner*—Benjamin Tzu-Hung Liu
(74) *Attorney, Agent, or Firm*—Ostrolenk, Faber, Gerb & Soffen, LLP

(57) ABSTRACT

A power MOSFET is disclosed in which the source and drain regions are reversed from their usual positions and the drain is on the top of the chip (the surface containing the junction pattern diffusions) and the source is on the bottom of the chip. A plurality of spaced trenches are formed in the top surface. One group of trenches contain gate polysilicon and a gate oxide to control an invertible channel region along the trench. A second group of the trenches have a buried source contact at their bottoms which are connected between the N source material to the P channel region to short out a parasitic bipolar transistor.

5 Claims, 3 Drawing Sheets

TOP DRAIN MOSFET

RELATED APPLICATION

The present application is based on and claims benefit of U.S. Provisional Application No. 60/539,549 filed Jan. 26, 2004, entitled TOP DRAIN MOSFET, to which a claim of priority is hereby made.

FIELD OF THE INVENTION

This invention relates to power MOSgated devices and more specifically relates to a vertical conduction MOSgated device in which the drain and gate are on the upper surface of the die and the source electrode is on the bottom surface of the die.

BACKGROUND OF THE INVENTION

Vertical conduction MOSgated devices are well known. By MOSgated device is meant a MOSFET, IGBT or the like. By a vertical conduction device is meant a device in which current conduction through the die is from one surface of the die, through the thickness of the die, and to its opposite surface. By die is meant a single die or chip which is singulated from a wafer in which all die within the wafer are simultaneously processed before singulation. The terms die, wafer and chip may be interchangeably used.

FIG. 1 shows a known type of vertical conduction MOSFET, using a trench type technology. FIG. 1 is a cross-section through a MOSFET die and shows one cell of a device in which a plurality of identical such cells are laterally disposed relative to one another. These cells may be parallel stripes, or closed cells of circular, rectangular, square, hexagonal or any other polygonal topology and may appear identical in a cross-sectional view.

In FIG. 1, the wafer or die has an N$^+$ substrate 20 of monocrystalline silicon (float zone, for example) which has a top epitaxially grown N type silicon layer, which includes drift region 21. A P type base implant and diffusion into the epitaxial layer forms the P base region 22, and an N type implant and diffusion forms the N$^+$ source region layer 23. Spaced trenches 24 and 25 (which may be striped or cellular) are formed in the top of the wafer. A silicon dioxide or other insulation liner has a thick bottom section 30 and a thin vertical gate section 31 which receive a conductive polysilicon gate electrode 32. A top oxide segment 33 completes an insulated enclosure for gate polysilicon 32. A source electrode 40 is then deposited atop the wafer or chip and fills trench 24 to short the N$^+$ source 23 to the P base, thereby to disable the parasitic bipolar transistor formed by regions 21, 22 and 23. A conductive drain electrode 41 is formed on the bottom of the die.

In operation, the application of a gate turn-on potential to gate 32 relative to source 40 will invert the concentration at the surface of P base 22 which lines oxide 31, thus permitting the flow of majority carriers from drain 41 to source 40.

It would be very desirable for many applications to reduce the capacitance between the gate and drain and the $Q_g$ and $Q_{sw}$ and to reduce the on resistance $R_{DSON}$ and gate resistance of the MOSgated device die of FIG. 1. It is also desirable to provide a MOSgated die structure which can be packaged in a variety of housings and can be copacked in a package with other die with reduced package resistance, minimal stray inductance, and good heat sinking capability.

BRIEF DESCRIPTION OF THE INVENTION

In accordance with the present invention, a novel MOSgated device is provided having reversed source and drain electrodes as compared to a conventional MOSFET. Thus, both the drain structure and gate structure are formed in the top of the chip, and the source is at the bottom of the chip. Spaced vertical gate trenches are formed into the top of the die or wafer. A base or channel invertible region is disposed adjacent the trench wall and is burried beneath an upper drift region. A further trench or cell disposed between the gate trenches permits the formation of a conductive region at its bottom to short the buried P base to the N$^+$ substrate. This novel reversal of functions produces a significant improvement in R*$Q_{sw}$ and R*A over current technology (60% and 26% respectively). It further enables a four times reduction in gate resistance and enables multiple packaging options for the copackaging of die.

More specifically, the structure permits a reduction of the drain to gate overlap and the use of a thicker oxide between gate and drain, thus producing a reduced $Q_{gd}$ and $Q_{sw}$. The design also allows the use of higher cell density and the elimination of the JFET effect both reduce $R_{DSON}$. Finally, the design permits the reduction of gate resistance.

DESCRIPTION OF THE DRAWINGS

Figure 1:
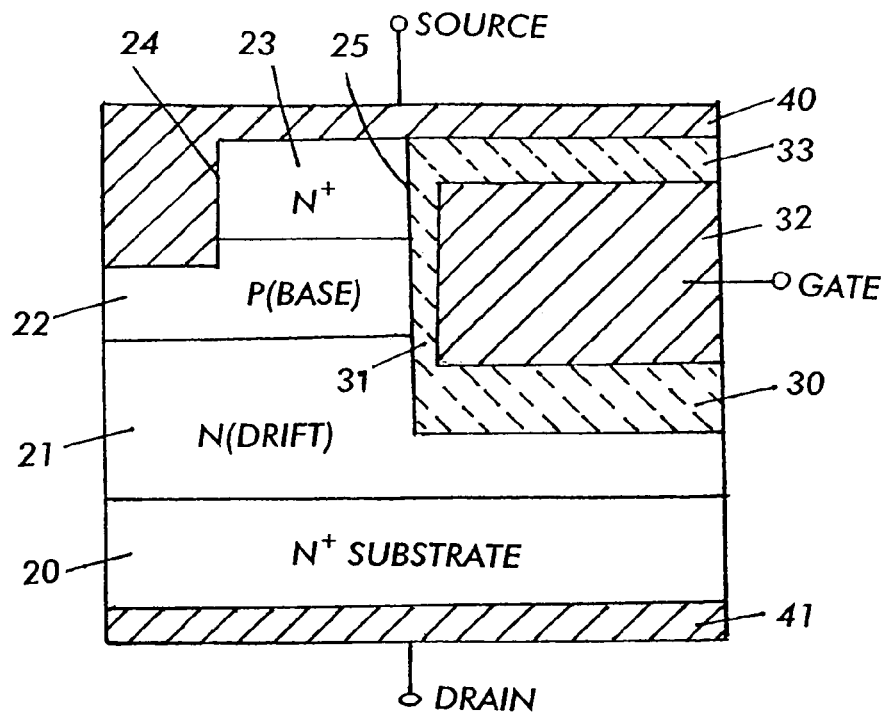
FIG. 1 is a cross-section of a cell of prior art trench type MOSFET.
Figure 2:
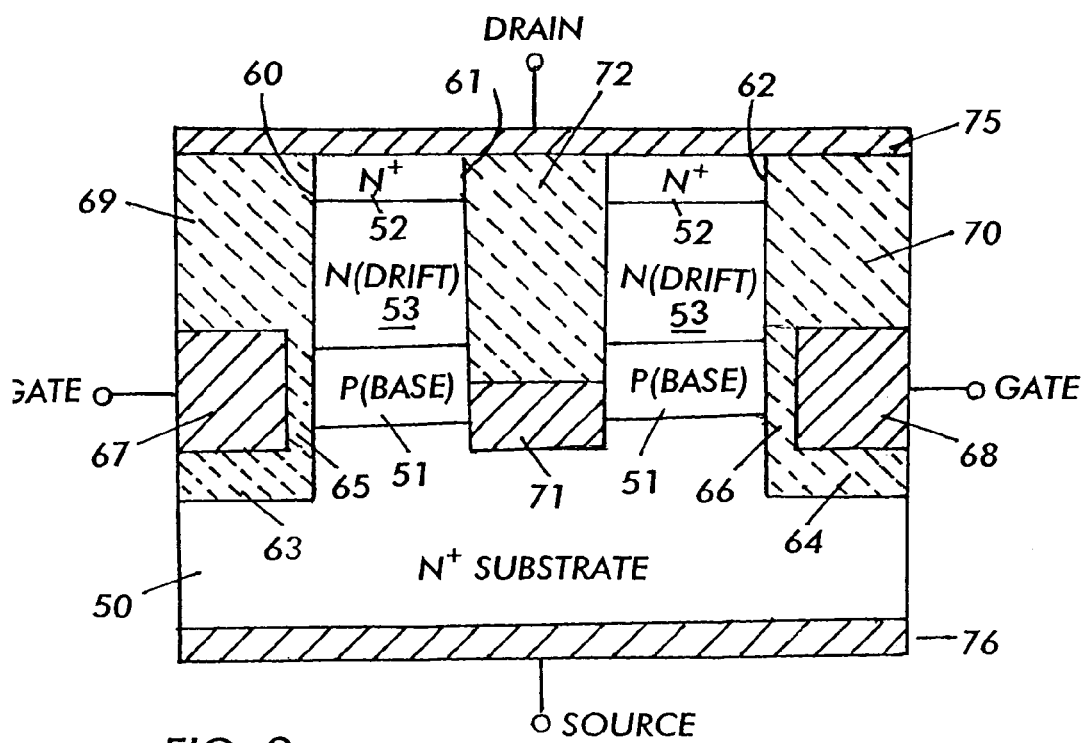
FIG. 2 is a cross-section of a cell of an embodiment of the present invention.

FIG. 2 is a cross-section of one cell of the novel top drain device of the invention. The device is shown as an N channel device, but all conductivity types can be reversed to produce a P channel device. Like the structure of FIG. 1, the die or wafer has an N$^+$ substrate 50 which has an N type epitaxial silicon layer formed on its upper surface. A P type implant and diffusion forms the buried P base or channel 51, and an N$^+$ implant and diffusion forms the drain region layer 52, into the top of N drift region layer 53. Three trenches 60, 61 and 62 are formed into the top of the die or wafer, forming the single cell shown. The outer trenches 60 and 62 are gate trenches and have vertical silicon dioxide (or other insulation) bottom layers 63 and 64 respectively, and vertical gate oxide layers 65 and 66 respectively. Conductive polysilicon layers 67 and 68 are formed to be contained within trenches 60 and 62 and insulated from the surrounding silicon by oxide layers 63, 65 and 64, 66 respectively. Oxide fillers 69 and 70 then fill the trenches 60 and 62 above polysilicon gates 67 and 68 respectively.

The central trench 61 receives a conductive layer 71 at its bottom to connect (short) the P base 51 to the N$^+$ substrate 50. The remainder of the trench 61 is then filled with insulation oxide 72.

A drain electrode 75, which may be aluminum with a small silicon content is formed over the top of the die or wafer, and a conductive source electrode 76 is formed on the wafer or die bottom.

To turn the device of FIG. 2 on, a potential applied to gate 67, 68 relative to substrate 50 will form an inversion region along the surfaces of base regions 51 to enable the conduction of majority carriers (electrons) from top drain 75 to bottom source electrode 76. Note again that all conductivity types can be reversed to form a P channel device, rather than the N channel device shown.

The effect of the novel structure of FIG. 2 permits a reduced overlap between the drain drift region 53 and gates 67, 68 producing a lower $Q_{gd}$ and $Q_{SW}$ as compared to that of FIG. 1. Further, a thicker oxide 65, 66 can be used between the gates 67, 68 and drain drift region 53, again reducing $Q_{gd}$ and $Q_{sw}$. Further, the cell density may be greater than that of FIG. 2 to reduce $R_{DSON}$, and the elimination of the JFET effect further reduces $R_{DSON}$.

In general, the Figure of Merit (FOM) of the structure of the top drain of FIG. 2 is considerably reduced as compared to that of FIG. 1 for an equivalent design for a 20 volt N channel MOSFET commercially sold by the International Rectifier Corporation (its "Gen 10.5" technology) as shown in the following table 1.

TABLE 1

| Technology FOM's | FIG. 1 (1.8 um pitch) Measured | FIG. 2 Top Drain FET (1.8 um pitch) Simulated | % Reduction in ROM over Gen 10.5 |
| --- | --- | --- | --- |
| $R_{si} \times AA$ @ Vgs = 4.5 V (mΩ-mm2) | 15.5 | 11.5 | 26% |
| $R_{si} \times$ Qswitch (mΩ-nC) | 48.3 | 19.1 | 60% |
| $R_{si} \times$ Qgd (mΩ-nC) | 38.6 | 17.0 | 56% |
| $R_{si} \times$ Qgd (mΩ-nC) | 103.7 | 36.9 | 64% |

Figure 3:
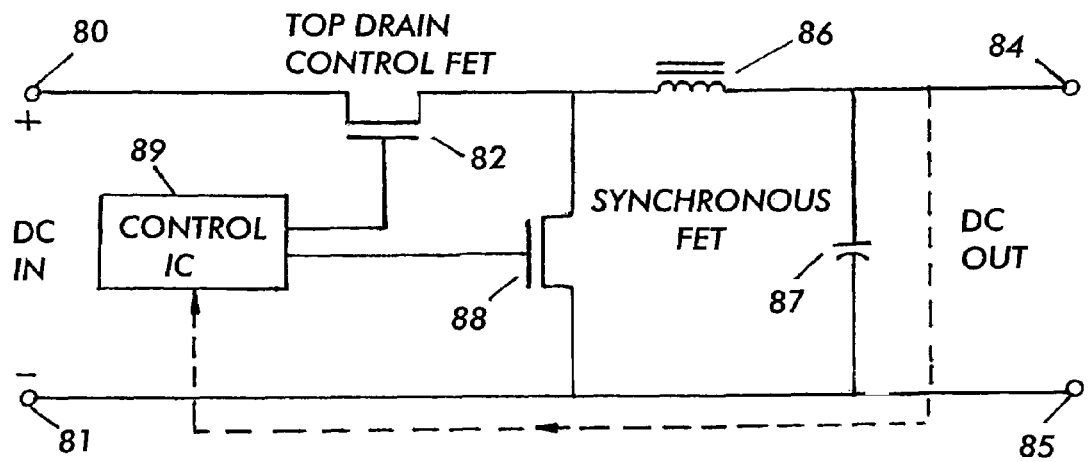
FIG. 3 is a circuit diagram of a buck converter circuit advantageously using a top drain MOSFET as the control FET.

The novel top drain structure of FIG. 2 has particular advantageous application as the control MOSFET in a dc-dc buck converter circuit of the kind shown in FIG. 3. In FIG. 3, an input dc voltage is applied to terminals 80 and 81. Terminal 80 is connected to control FET 82 which is in turn connected to output terminals 84 and 85, through inductor 86. An output capacitor 87 is also conventionally provided. A synchronous FET 88 (which acts as a diode) is connected as shown, and both FETs 82 and 88 are controlled by a control IC 89 to pulse-width-modulate the conduction of FETs 82 and 88 to maintain a given output voltage at terminals 84 and 85. Conventionally, FET 88 is turned on when FET 82 is turned off, and vice versa to permit continuous current flow in inductor 86.

It is well known that the control FET 82 which may be switched at frequencies up to and above about one megahertz should have the smallest possible $Q_{gd}$ and $Q_{sw}$ and gate resistance to reduce power loss in the control FET. Thus, the novel top drain structure of the invention has particular beneficial applications to this kind of circuit. It can be shown that the use of the novel MOSFET of FIG. 2 for the control FET of FIG. 3 will produce a 21% reduction in power loss at 1 MHZ.

Figure 4:
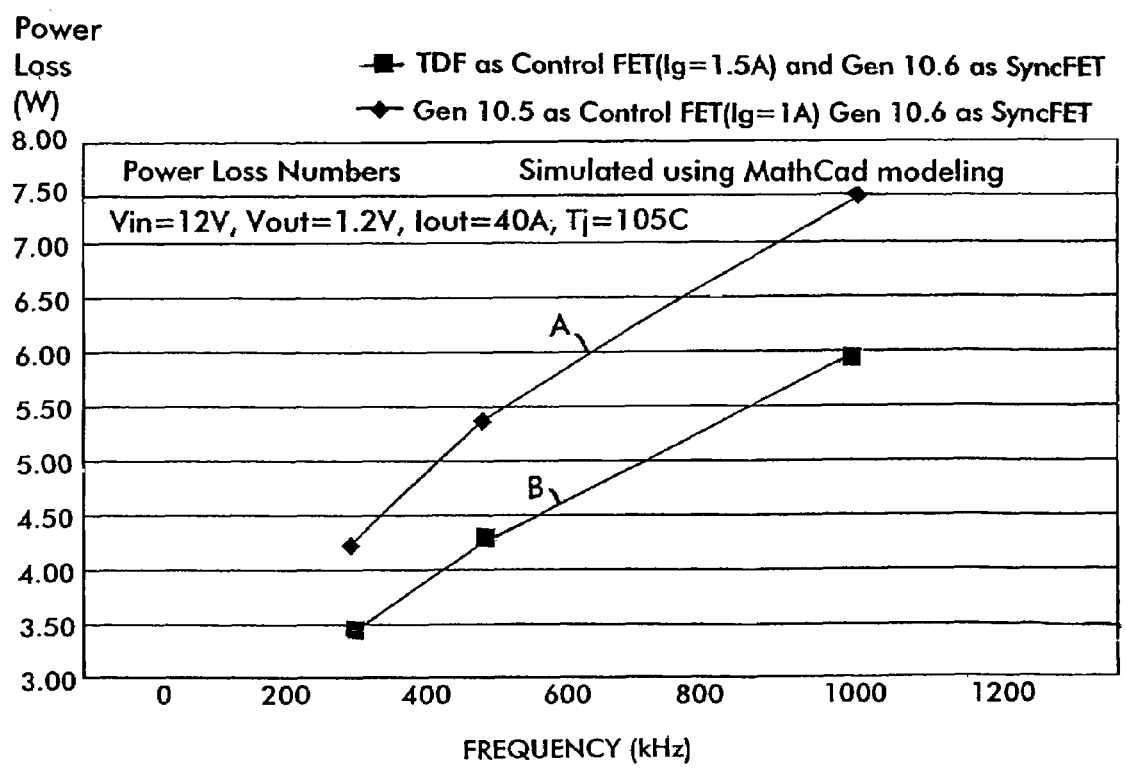
FIG. 4 shows the reduction in power loss in the circuit of FIG. 3 by using a top drain FET for the control FET.

More specifically, curve A of FIG. 4 shows simulated power loss as a function of frequency for the circuit of FIG. 3 in which both MOSFETs of FIG. 3 are of the type shown in FIG. 1. By replacing FET 82 by a top drain FET of the type shown in FIG. 2, curve B of FIG. 4 is produced, showing a 21% reduction in power loss.

As a further benefit of the reduced gate resistance provided by the device of FIG. 2, higher gate drive currents can be used. Thus, in a 4-phase circuit of the type of FIG. 3, the power loss of the circuit is further reduced with increased gate current per phase.

Figure 5:
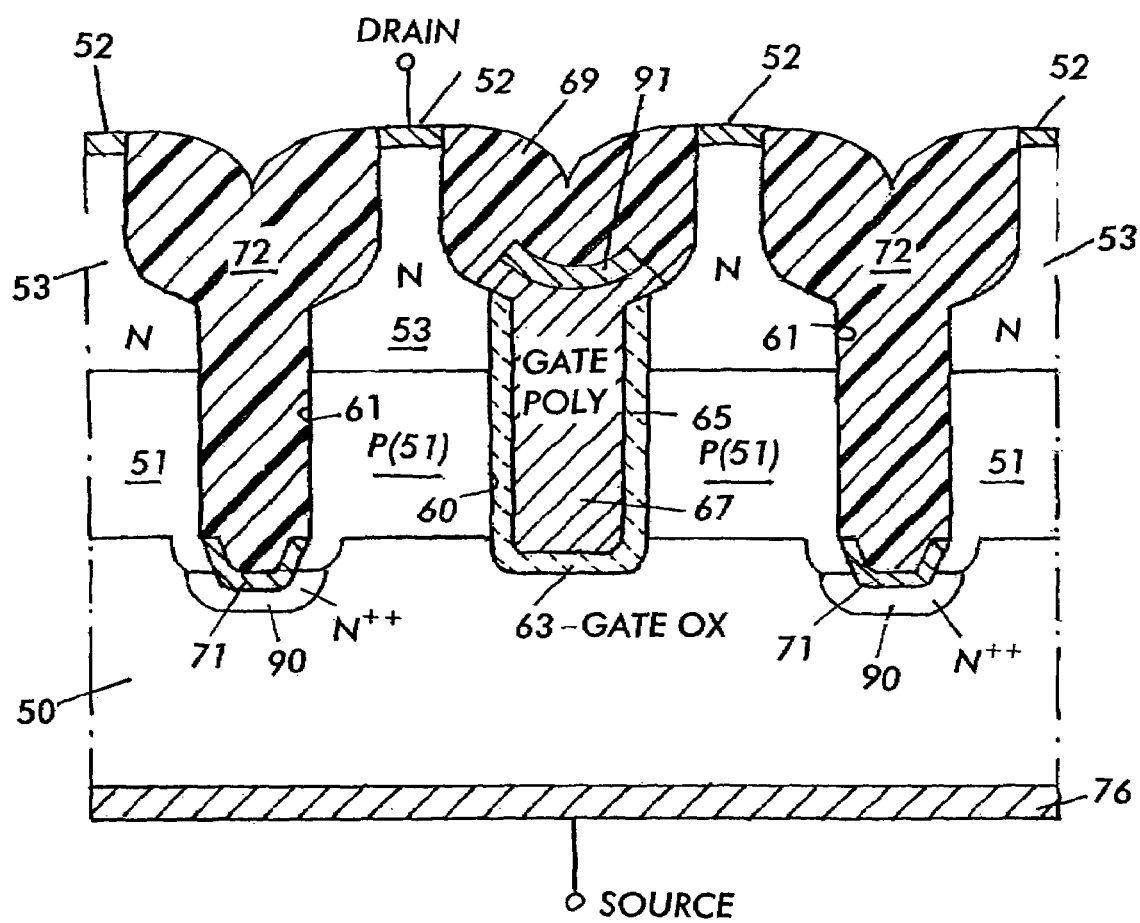
FIG. 5 is a cross-sectional view of a second embodiment of the invention.

Referring next to FIG. 5, components similar to those of FIG. 2 have similar identifying numerals. However, it will be noted that in FIG. 5, contact 71 is formed of a conductive silicide. Further, an $N^{++}$ implant 90, carried out before insulation plug 72 is formed ensures a good connection for shorting the source substrate 50 to the P channel region 51.

Further, FIG. 5 shows the use of a silicide layer 91 atop the gate polysilicon 67 to reduce lateral gate resistance.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A mosgated device comprising:
    a silicon chip having top and bottom parallel surfaces and including:
        a drain region adjacent to said top surface;
        a channel region under said drain region; and
        a source region under said channel region;
    said mosgated device having a drain electrode facing a first direction and a source electrode facing a second direction opposite said first direction, said drain electrode being disposed on said top surface and covering a full surface of said drain region exposed at said top surface, and said source electrode being disposed on said bottom surface, a plurality of parallel trenches formed in said top surface; a first group of said trenches each containing a mosgate electrode having a silicide layer atop thereof to reduce lateral resistance, and extending along said channel region to enable and prevent conduction between said drain and source electrodes, a second group of parallel trenches; each of said second group of trenches having a silicide layer at the bottom thereof which connects said channel region and said source region; and an implant region of the same conductivity as, and doped to a greater concentration than, said source region under each silicide layer.

2. The device of claim 1, further comprising a plurality of doped implant regions each having a same conductivity type as said source region and each being formed within said source region below a respective one of said conductive regions at the bottom of said second group of trenches, said plurality of doped implant regions ensuring good connection between said channel and source regions.

3. A mosgated device comprising:
    a silicon chip having top and bottom parallel surfaces and including:
        a drain region adjacent to said top surface;
        a channel region under said drain region; and
        a source region under said channel region;
    a first plurality of trenches formed in said top surface of said silicon chip and each containing a mosgate electrode having a silicide layer atop thereof to reduce lateral resistance and extending along said channel region;
    a second plurality of trenches formed in said top surface of said silicon chip and each having a bottom end;

a layer of silicide at the bottom end of each of said second plurality of trenches connecting said source and channel regions;

a doped implant region having a same conductivity type as, and doped to a greater concentration than, said source region formed within said source region below a respective silicide layer, said doped implant regions ensuring good connection between said source and channel regions; and a drain electrode facing one direction and a source electrode facing another direction opposite said one direction, said drain electrode being disposed on said top surface, and said source electrode being disposed on said bottom surface.

4. The device of claim 3, wherein said second plurality of trenches are interlaced and spaced from said first plurality of trenches.

5. The device of claim 3, wherein said drain electrode covers a full surface of said drain region exposed at said top surface.

* * * * *